US006642736B2

United States Patent
Mori et al.

(10) Patent No.: US 6,642,736 B2
(45) Date of Patent: *Nov. 4, 2003

(54) TESTER FOR SEMICONDUCTOR INTEGRATED CIRCUITS AND METHOD FOR TESTING SEMICONDUCTOR INTEGRATED CIRCUITS

(75) Inventors: Hisaya Mori, Hyogo (JP); Shinji Yamada, Hyogo (JP); Teruhiko Funakura, Tokyo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 115 days.

This patent is subject to a terminal disclaimer.

(21) Appl. No.: 09/904,625

(22) Filed: Jul. 16, 2001

(65) Prior Publication Data
US 2002/0062200 A1 May 23, 2002

(30) Foreign Application Priority Data
Nov. 22, 2000 (JP) .......................................... 2000-356724

(51) Int. Cl.[7] .......................... G01R 31/02; G01R 31/26; G01R 31/28
(52) U.S. Cl. ..................... 324/765; 324/763; 324/158.1; 714/724; 714/733
(58) Field of Search ..................... 324/158.1, 754–765, 324/324; 714/724–734

(56) References Cited

U.S. PATENT DOCUMENTS

| 5,509,019 A | * | 4/1996 | Yamamura | 714/718 |
| 5,548,884 A | * | 8/1996 | Kim | 29/593 |
| 5,986,460 A | * | 11/1999 | Kawakami | 324/765 |
| 6,359,455 B1 | * | 3/2002 | Takekoshi | 324/754 |

FOREIGN PATENT DOCUMENTS

JP 1-316024 12/1989

* cited by examiner

Primary Examiner—Kamand Cuneo
Assistant Examiner—Emily Y Chan
(74) Attorney, Agent, or Firm—McDermott, Will & Emery (57) ABSTRACT

To provide a tester for semiconductor integrated circuits that can test an A/D converter circuit and a D/A converter circuit in a mixed signal type semiconductor integrated circuit comprising an A/D converter circuit and a D/A converter circuit at high accuracy and at high speed. A test assisting device is provided in the vicinity of a testing circuit board on which a semiconductor integrated circuit to be tested is mounted. The test assisting device comprises a data circuit to supply analog test signals to the A/D converter circuit of the semiconductor integrated circuit to be tested, and digital test signals to the D/A converter circuit thereof, a measured data memory to store test outputs from the semiconductor integrated circuit to be tested, and an analyzer portion to analyze data stored in the measured data memory.

18 Claims, 6 Drawing Sheets

TESTER FOR SEMICONDUCTOR INTEGRATED CIRCUITS AND METHOD FOR TESTING SEMICONDUCTOR INTEGRATED CIRCUITS

BACKGROUND OF THE INVENTION

1. Field of the Invention

The present invention relates to a tester for semiconductor integrated circuits and a method for testing semiconductor integrated circuits, and more specifically to a tester for semiconductor integrated circuits comprising an A/D converter circuit to convert analog signals to digital signals, and a D/A converter circuit to convert digital signals to analog signals and a method for testing the semiconductor integrated circuits.

2. Background Art

The tester for semiconductor integrated circuit is called simply a tester. In recent years, in a system LSI constituted as a one-chip semiconductor integrated circuit constituted by a plurality of functionally systematized modules (1-chip LSI) or a hybrid integrated circuit in which chips of a plurality of circuits are combined (chip-set LSI), integration by combining high-performance, high-accuracy digital circuits and analog circuits (mixed-signalization) is being progressed rapidly, the testers for these semiconductor integrated circuits to cope with this mixed-signalization is also being progressed rapidly, and testers for testing mixed signal semiconductor integrated circuits are provided from tester manufacturers.

However, in order to accommodate the high-performance specifications of the mixed signal semiconductor integrated circuits, the testers tend to be expensive. Under such a situation, there has been a movement to avoid increase in the cost of tester through the reuse of existing low-speed, low-accuracy testers used, for example, for logic LSIs.

A significant problem to be solved in such testers is the test of D/A converter circuits to convert digital signals to analog signals and A/D converters to convert analog signals to digital signals. With increase in accuracy of these converter circuits, the problem is how to realize testers for semiconductor integrated circuits comprising these converter circuits at low cost.

In a general test circumstance for testers, along a measurement path from a measuring instrument inside the tester to the semiconductor integrated circuit to be tested (hereafter called DUT), there are a plurality of jigs to connect between the tester and the DUT, such as a DUT circuit board (DUT board) and cable, and the measurement path is long, causing noise to occur and measurement accuracy to be reduced, and it is difficult to test of plurality of the DUT at a time. Also, since a low-speed tester cannot test the DUT at a practical speed due to its speed restriction, increase in testing time for testing mass-produced DUTs is concerned.

Japanese Patent Laid-Open No. 1-316024 proposes a tester comprising a memory element for storing converted data in the address specified by input data to the D/A converter of the testing circuit, in which D/A converted analog signals are inputted to the A/D converter, the outputs of the A/D converter are sequentially stored in the memory element, the converted data stored in the memory element are sequentially transmitted to the tester when all the inputted data have been converted, and the inputted data are sequentially compared with the converted data in the tester.

However, since the inputted data to the D/A converter, the addresses of the memory element for storing converted data, and the control signals must be supplied from the tester, and furthermore, since the data stored in the memory element must be supplied to the tester, the measurement accuracy may be lowered due to noise in the long measurement path between the DUT and the tester. Also due to the occupation of the number of tester pin electronics, the simultaneous measurement of more than one DUT is difficult. Furthermore, since communication to transmit converted data to the tester takes much time, and the test results are judged after all the tests have been completed, the reduction of time is also difficult.

SUMMARY OF THE INVENTION

An object of the present invention is to solve such problems, and to provide a tester for semiconductor integrated circuits and a method for testing semiconductor integrated circuits that can realize high-speed, high-accuracy measurement at low costs.

Another object of the present invention is to realize high-speed, high accuracy measurement, and to provide a tester for semiconductor integrated circuits and a method for testing semiconductor integrated circuits that can test more than one semiconductor integrated circuits at a time.

According to one aspect of the present invention, a tester for semiconductor integrated circuits, comprises a testing circuit board configured to transmit signals to and receive signals from a semiconductor integrated circuit to be tested that comprises an A/D converter circuit to convert analog signals to digital signals and a D/A converter circuit to convert digital signals to analog signals, a test assisting device disposed in the vicinity of and connected to the testing circuit board; and a test machine connected to the test assisting device. The test assisting device comprises a data circuit to generate digital test signals and to supply the digital test signals to the D/A converter circuit of the semiconductor integrated circuit to be tested, a testing D/A converter circuit to convert the digital test signals from the data circuit to analog test signals and to supply the analog test signals to the A/D converter circuit of the semiconductor integrated circuit to be tested, a testing A/D converter circuit to convert analog test outputs from the D/A converter circuit of the semiconductor integrated circuit to be tested to digital test outputs, a measured data memory to store the digital test outputs from the A/D converter circuit of the semiconductor integrated circuit to be tested and the digital test outputs of the testing A/D converter circuit, and an analyzer portion to analyze each of the digital test outputs stored in the measured data memory. The tester for semiconductor integrated circuits is configured to supply the digital test signals and the analog test signals to the semiconductor integrated circuit to be tested based on instructions from the test machine, and to supply the results of analysis of each digital test output stored in the measured data memory by the analyzer portion to the test machine.

According to another aspect of the present invention, a method for testing semiconductor integrated circuits comprising an A/D converter circuit for converting analog signals into digital signals, and a D/A converter circuit for converting digital signals into analog signals, wherein the test of the semiconductor integrated circuit is conducted in such a manner. A test assisting device is disposed in the vicinity of a testing circuit board configured to transmit signals to and receive signals from the semiconductor integrated circuit to be tested. The test assisting device have a data circuit for generating digital test signals to supply the digital test signals to the D/A converter circuit of the semiconductor integrated circuit to be tested, a testing D/A converter circuit for converting the digital test signals from the data circuit into analog test signals to supply the analog test signals to the A/D converter circuit of the semiconductor integrated circuit to be tested, a testing A/D converter circuit for converting analog test outputs of the D/A converter circuit of the semiconductor integrated circuit to be tested into digital test outputs, a measured data memory for storing the digital test outputs from the A/D converter circuit of the semiconductor integrated circuit to be tested and the digital test outputs of the testing A/D converter circuit, and an analyzer portion to analyze each of the digital test outputs stored in the measured data memory. The digital test signals and the analog test signals are supplied to the semiconductor integrated circuit to be tested according to instructions from a test machine, and the results of analysis of respective digital test outputs stored in the measured data memory by the analyzer portion are supplied to the test machine.

According to the present invention, since the test assisting device disposed in the vicinity of the testing circuit board is provided with a data circuit, a testing D/A converter circuit, a testing A/D converter circuit, a measured data memory, and a DSP analyzing portion, and the test assisting device is made to conduct the test of the A/D converter circuit and the D/A converter circuit of a semiconductor integrated circuit to be tested, the test of a mixed signal type semiconductor integrated circuit comprising an A/D converter circuit and a D/A converter circuit can be conducted at high accuracy and high speed, and the cost reduction of the tester can be achieved.

Other and further objects, features and advantages of the invention will appear more fully from the following description.

DETAILED DESCRIPTION OF THE PREFERRED EMBODIMENTS

First Embodiment

Figures 1A, 1B:
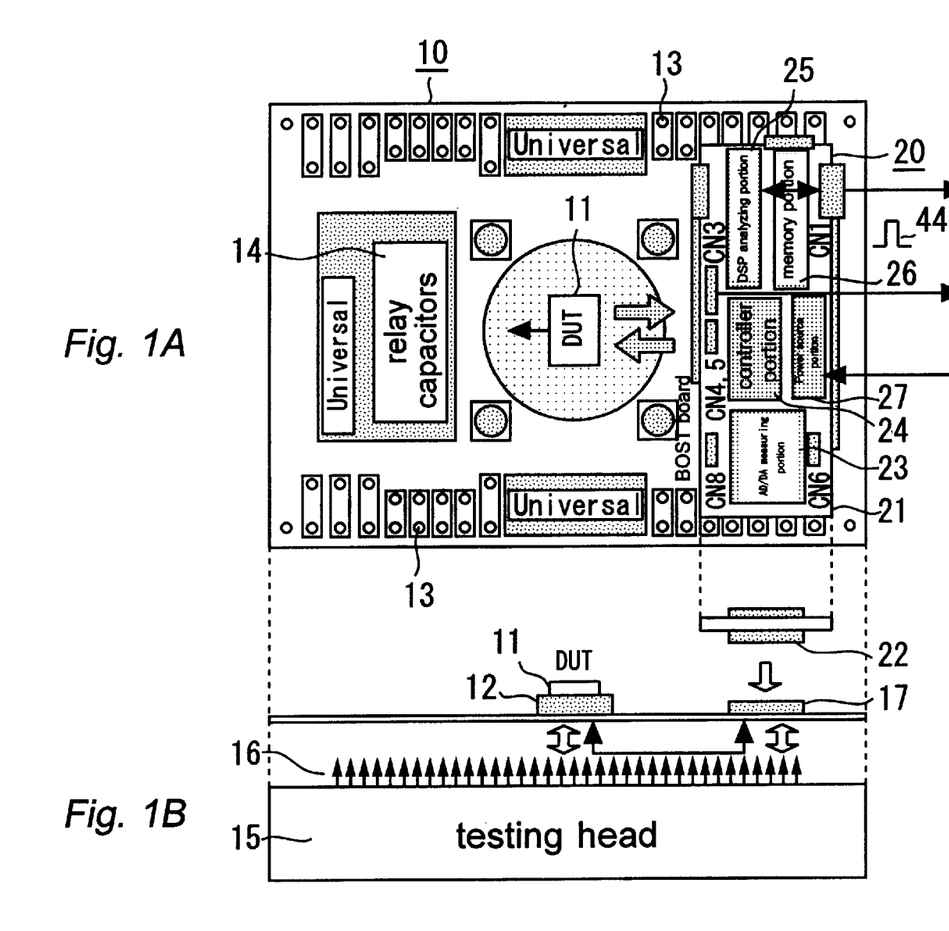
FIGS. 1A to 1C are diagrams to show the configuration of First Embodiment of a tester for semiconductor integrated circuits, and a testing method using the same according to the present invention.
Figure 1C:
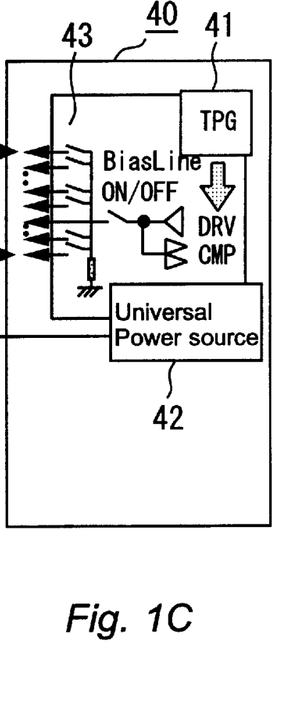

FIG. 1 is a diagram to show the configuration of First Embodiment of a tester f or semiconductor integrated circuits, and a testing method using the same according to the present invention. FIG. 1A is a top view of the testing circuit board (DUT board), FIG. 1B is a side view thereof, and FIG. 1C is a configuration diagram of a test machine (tester).

The tester of First Embodiment comprises a testing circuit board (DUT board) 10, a test assisting device (BOST device) 20, and a test machine (tester) 40.

In First Embodiment, the testing circuit board 10 is for testing a molded IC as a semiconductor integrated circuit to be tested (DUT) 11. The molded IC is a semiconductor integrated circuit (IC) chip covered with a molding resin, and having a number of terminals led out of the molding resin. The IC chip of this DUT 11 is, for example, a one-chip mixed signal type system LSI that comprises a D/A converter to convert digital signals to analog signals, and an A/D converter to convert analog signals to digital signals in one chip. The DUT 11 may also be a mixed signal type hybrid integrated circuit (hybrid 1C) in which a plurality of chips are integrated on a common circuit board.

The testing circuit board 10 has a DUT socket 12 to plug the terminals of a semiconductor integrated circuit (DUT) 11, and a large number of connecting terminals 13 and relay capacitors 14 for the test are disposed around the DUT socket 12.

Underneath the testing circuit board 10 is disposed a testing head 15. The testing head 15 has a large number of connecting pins 16 to be connected to the testing circuit board 10, and required signals are transmitted to and receive from the DUT 11 via these connecting pins 16.

The test assisting device (BOST device) 20 is disposed in the vicinity of the testing circuit board 10. In First Embodiment, the test assisting device 20 is formed on a test assisting board (BOST board) 21, and the BOST board 21 is mounted on the DUT board 10. A socket 17 for mounting the BOST board 21 is fixed on the DUT board 10. The BOST board 21 has a connector 22 that is plugged in the socket 17 on the bottom surface, and is supported on the DUT board 10 by plugging the connector 22 in the socket 17, and signals are transmitted to or received from the testing head 15 via this socket 17.

The BOST (abbreviation of Built-Off-Self-Test) board 21 is a board of the DUT external test assisting device for assisting the testing circuit to conduct the self test inside the DUT (BIST: Built-In-Self-Test) without depending on the tester 40, and comprises an AD/DA measuring portion 23, a controller portion 24, a DSP analyzer portion 25, a memory portion 26, and a power source portion 27.

The tester 40 comprises a test pattern generator (TPG) 41, a power source portion 42, and a pin electronics portion 43; supplies source voltage Vd to the BOST board 21; and transmit and receive BOST control signals 44 to and from the BOST board 21. The BOST control signals 44 contains not only the instruction signals from the tester 40 to the BOST board 21 and the DUT board 10, but also the test analysis result signals from the BOST board 21 to the tester 40. The control signals 44 that contain the test analysis No., code, and the like inputted from the tester 40 to the BOST board 21 are generated as test pattern signals from the test pattern generator 41 built in the tester 40 based on the test signal conditions described in the test program in the same manner as in the test for other DUTs 11, and are supplied to the BOST board 21 and the DUT board 10 through the pin electronics portion 43 of the tester 40 comprising a plurality of signal input/output pins. On the other hand, the test analysis result signal (pass/fail information) outputted from the BOST board 21 is transmitted to the pin electronics portion 43 of the tester 40, and based on the comparison with the test pattern signals and the judgment at the judging portion of the pin electronics portion 43, the result information is taken in the tester.

Figure 2:
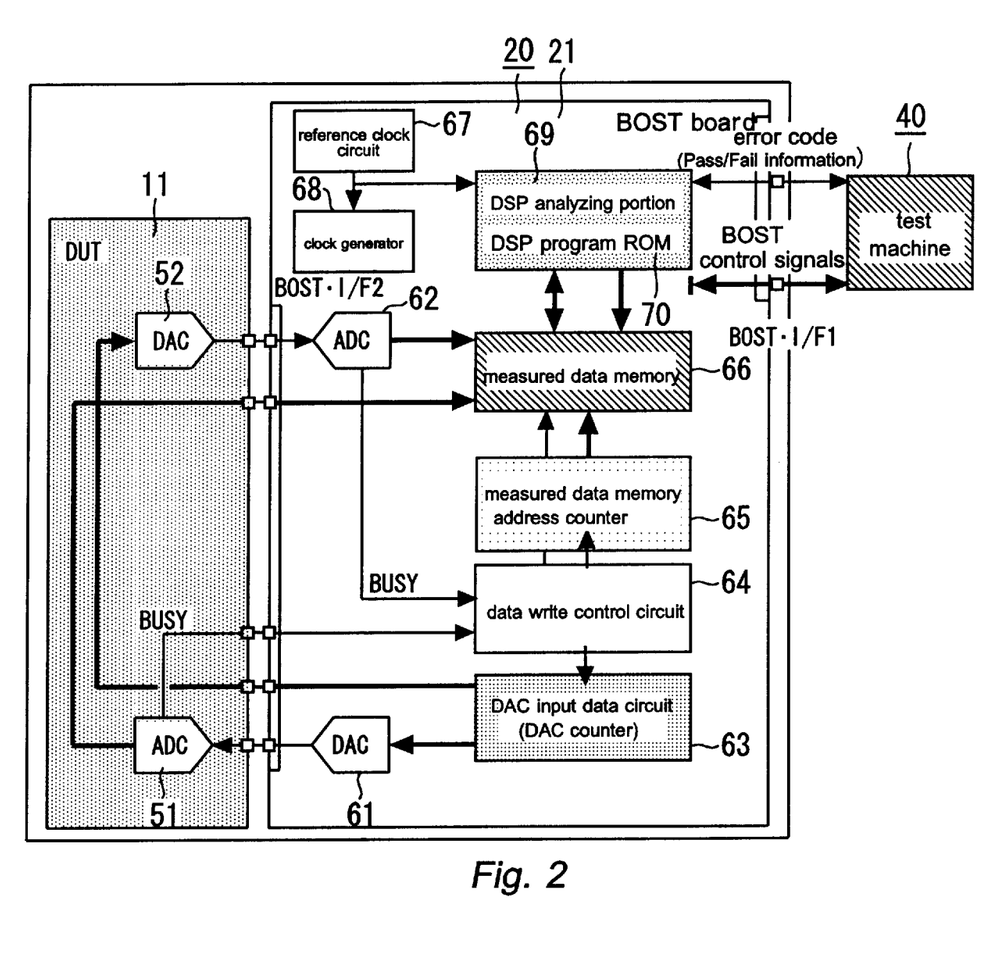
FIG. 2 is a block diagram that shows the configuration of an electric circuit in First Embodiment.

FIG. 2 is a block diagram that shows the configuration of an electric circuit in First Embodiment. The DUT 11 comprises an A/D converter circuit 51 that converts analog signals to digital signals, and a D/A converter circuit 52 that converts digital signals to analog signals.

The BOST board 21 comprises a testing D/A converter circuit 61 that supplies analog test signals to the A/D converter circuit 51 of the DUT 11, and a testing A/D converter circuit 62 that converts analog test outputs from the D/A converter circuit 52 of the DUT 11 to digital test outputs. The BOST board 21 further comprises a DAC input data circuit (DAC counter) 63, a data write control circuit 64, a measured data memory address counter 65, a measured data memory 66, a reference clock circuit 67, a clock generator circuit 68, and a DSP analyzing portion 69. The DSP analyzing portion 69 comprises a DSP program ROM 70.

The testing D/A converter circuit 61, the testing A/D converter circuit 62, the DAC input data circuit 63, the data write control circuit 64, and the measured data memory address counter 65 are contained in the D/A and A/D measuring portion 23 in FIG. 1, the measured data memory 66 is contained in the memory portion 26, and the DSP analyzing portion 69 is contained in the DSP analyzing portion 25.

Digital signals for testing (test data) are stored in the DAC input data circuit 63, and based on the command from the tester 40, the test data from this DAC input data circuit 63 are supplied to the D/A converter circuit 52 of the DUT 11 and the testing D/A converter circuit 61 of the BOST board 21.

Digital signals for testing (test data) supplied to the testing D/A converter circuit 61 are converted to analog test signals, supplied to the A/D converter circuit 51 of the DUT 11, converted to digital test outputs in this A/D converter circuit 51 of the DUT 11, and supplied to the measured data memory 66.

On the other hand, digital test signals directly supplied from the DAC input data circuit 63 to the D/A converter circuit 52 of the DUT 11 are converted to analog test outputs in the D/A converter circuit 52, and further converted to digital test outputs in the A/D converter circuit 62 of the BOST board 21, which are supplied to the measured data memory 66.

The measured data memory 66 stores these digital test outputs supplied from the A/D converter circuit 51 of the DUT 11, and digital test outputs supplied from the D/A converter circuit 52 through the A/D converter circuit 62 sequentially in specified addresses.

The A/D converter circuit 51 of the DUT 11 and the A/D converter circuit 62 of the BOST board 21 convert analog signals to digital signals sequentially, and respectively output BUSY signals each time one digital signal is generated. These BUSY signals are supplied to the data write control circuit 64 on the BOST board 21. Based on the supplied BUSY signals, the data write control circuit 64 advances the digital test data of the DAC input data circuit 63 sequentially to next digital test data for each data unit, and act to advance the address of the measured data memory 66 for the measured data memory address counter 65.

Thus, by BUSY signals, the codes of the digital test data converted in the DUT 11 are advanced in the DAC input data circuit 63, and in the measured data memory 66 the addresses to store digital test outputs converted in the DUT 11 are sequentially advanced, and therefore conversion required for the test is sequentially performed in the A/D converter circuit 51 and the D/A converter circuit 52 in the DUT 11, and the converted measured data are sequentially stored in the measured data memory 66. Thereafter, conversion test is continued until the last code set in the DSP analyzing portion 69 of the BOST board 21, and all the results are stored in the measured data memory 66.

After the completion of the converting test by the A/D converter circuit 51 and the D/A converter circuit 52 in the DUT 11, the DSP analyzing portion 69 on the BOST board 21 reads sequentially the converted data stored in the measured data memory 66 using the program stored in the DSP program ROM 70, and analyzes the conversion properties. This analysis include the calculations of the A/D conversion property parameters, D/A conversion property parameters, differential linearity, integral non-linear error, and the like, and the result of analysis (pass/fail information) is transmitted from the BOST board 21 to the tester 40, where the test results are processed.

In First Embodiment, since the BOST board 21 is disposed in the vicinity of the DUT board 10, and has the function to conduct the conversion test of the A/D converter circuit 51 and the D/A converter circuit 52 of the DUT 11, this conversion test can be conducted on the BOST board 21. As a result, the analog measurement system line between the DUT board 10 and the BOST board 21 can be shortened, the occurrence of measurement errors due to noise can be restricted sufficiently, the high-accuracy test can be realized, and based on transmitting and receiving of signals between the DUT board 10 and the nearby BOST board 21, the test can be conducted at a higher speed. Since the analog measurement system line can be eliminated between the BOST board 21 and the tester 40, the accuracy of the test can be improved. Also, since the required conversion test is completed on the BOST board 21, and the results are transmitted to the tester 40, the test speed can be improved compared with the ones to transmit converted data to the tester 40.

In First Embodiment, since the conversion test function of the A/D converter circuit 51 and the D/A converter circuit 52 is disposed on the BOST board 21, the large function therefor is not required to add to the tester 40, and increase in the costs of the tester 40 can be prevented, and even a conventional low-speed tester can be utilized. When a tester 40 having a special measurement function is manufactured, since the expansion of functions by a hardware configuration is limited, and the improvement of the tester itself is required, the costs for development may increase. According to First Embodiment, since the test pattern generator and pin electronics typically used in general testers are utilized, the BOST board can be configured and controlled without being affected by various specifications and restrictions of the testers, and application to various testers can be made.

Second Embodiment

Figure 3:
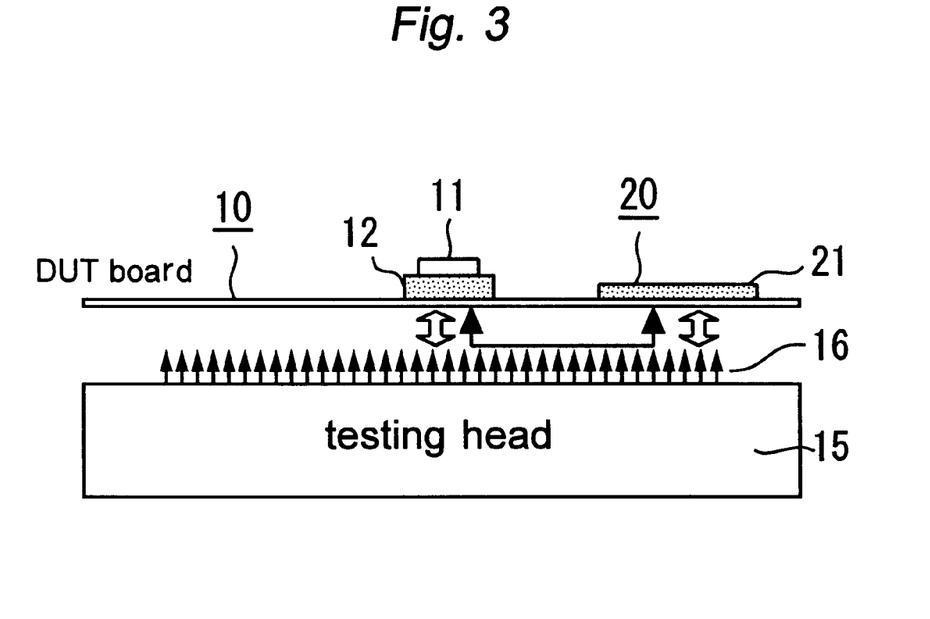
FIG. 3 is a side view that shows the DUT portion of Second Embodiment of a tester for semiconductor integrated circuits according to the present invention.

FIG. 3 is a side view that shows the DUT portion of Second Embodiment of a tester for semiconductor integrated circuits, and a testing method using the same according to the present invention. In Second Embodiment, the BOST board 21 of First Embodiment is placed on the upper surface of the DUT board 10. Also in Second Embodiment, a molded semiconductor integrated circuit is plugged in the socket 12 on the DUT board 10, and the A/D converter 41 and the D/A converter 42 thereof are tested.

In FIG. 3, a BOST board 21 is disposed on the right upper surface of the DUT board 10, the both boards are connected at this portion, and signals are transmitted and received between the both boards and the test head 15. The configuration on the BOST board 20 is the same as the configuration of FIG. 1, and the circuit configuration thereof is the same as the circuit configuration of FIG. 2.

Third Embodiment

FIG. 4 shows the configuration of the DUT portion of Third Embodiment of a tester for semiconductor integrated circuits, and a testing method using the same according to the present invention. FIG. 4A is a top view of the BOST board 21A, FIG. 4B is a top view of the BOST IF board, FIG. 4C is a top view of the DUT board 10A, and FIG. 4D is a side view thereof. In Third Embodiment, a semiconductor integrated circuit in a wafer state is subjected to the test (DUT). The DUT board 10A is a probe card configured circularly, and has a large number of probes 30 for the wafer 11A on the lower surface of the central portion thereof. A BOST IF board 32 is disposed on the DUT board 10A via a connecting structure 31, and a connector 33 is fixed on the BOST IF board 32. The BOST board 21A that constitutes the BOST device 20 is also configured circularly, and the AD/DA measuring portion 23, a controller portion 24, a memory portion 26, a DSP analyzing portion 25, and a power source 27 are also disposed on the upper surface of this BOST board 21A.

The configuration of the electric circuit of Third Embodiment is the same as the configuration of FIG. 2 in First Embodiment, and the test similar to First Embodiment is conducted by making the probe 30 contact a large number of terminals on the portion corresponding to the chip of the wafer 11A. The portion corresponding to the chip of the wafer 1A is sequentially moved, and adjacent portions corresponding to chips are sequentially tested.

Fourth Embodiment

Figure 5A:
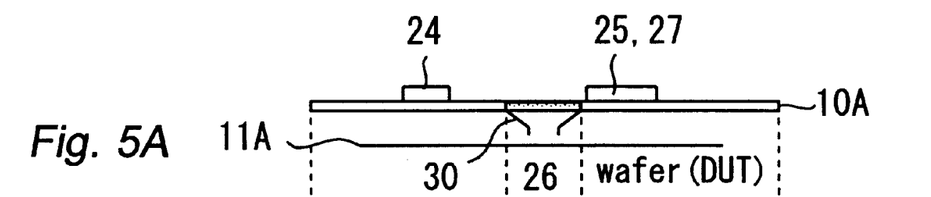
FIGS. 5A and 5B show the DUT portion of Fourth Embodiment of a tester for semiconductor integrated circuits, and a testing method using the same according to the present invention.
Figure 5B:
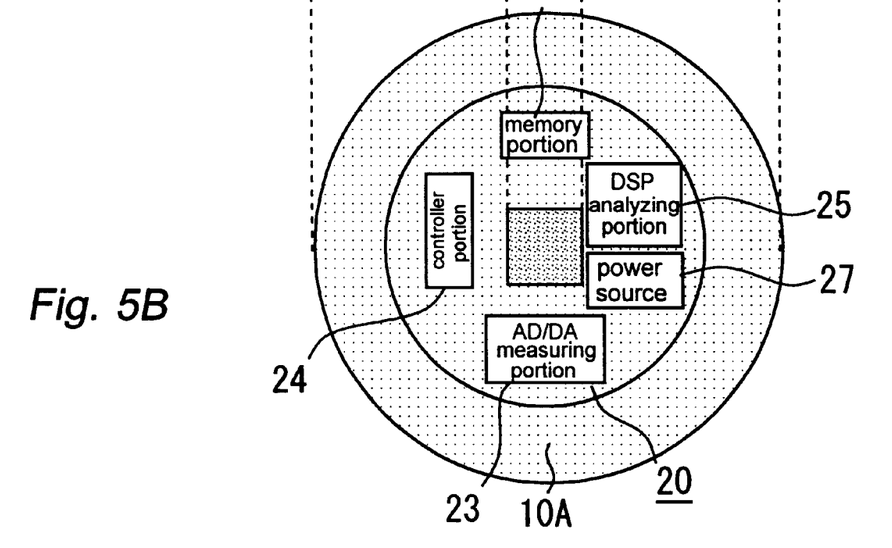

FIG. 5 shows the DUT portion of Fourth Embodiment of a tester for semiconductor integrated circuits, and a testing method using the same according to the present invention, FIG. 5A being a side view and FIG. 5B being a top view. In Fourth Embodiment, the BOST board 20A in Third Embodiment is omitted, and the BOST IF board 17 and the connecting structure 16 are also omitted. Required connection is performed by disposing all of an AD/DA measuring portion 21, a controlling portion 22, a memory portion 24, a DSP analyzing portion 23, and a power source portion 25, which constitute the BOST device 20, on the upper surface of the DUT board 10A having probes 30.

The circuit configuration of Fourth Embodiment is the same as the configuration of FIG. 2 in First Embodiment, and the test of the A/D converter circuit 51 and the D/A converter circuit 52 of the DUT 11A is conducted in the same matter as in First Embodiment.

Figure 4A:
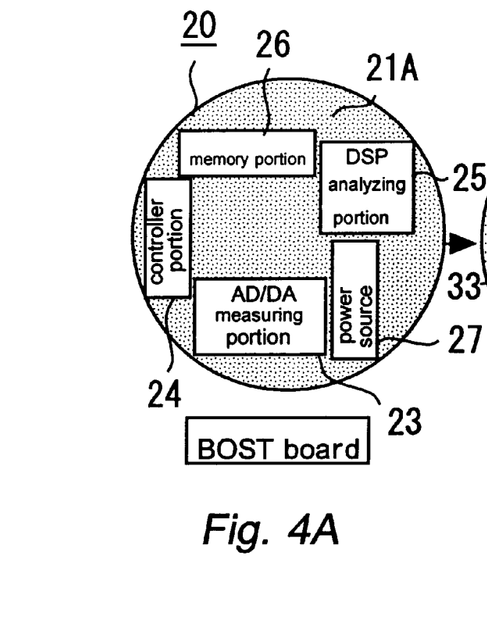
FIGS. 4A to 4C show the configuration of the DUT portion of Third Embodiment of a tester for semiconductor integrated circuits, and a testing method using the same according to the present invention.
Figure 4B:
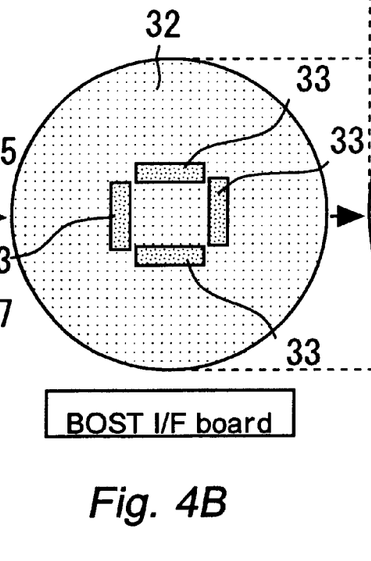
Figure 4C:
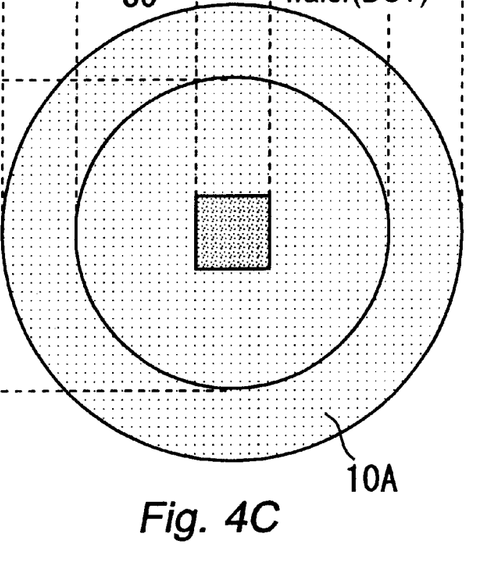
Figure 4D:
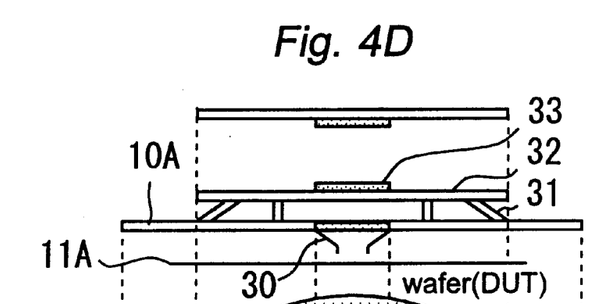

In Second Embodiment, Third Embodiment, and Fourth Embodiment, since the BOST device 20, or the BOST board 21 or 21A is disposed in the vicinity of the DUT board 10 or 10A, and the test is conducted in the same manner as in First Embodiment, high-accuracy, high-speed test, and the cost reduction of the device can be achieved as in First Embodiment.

Fifth Embodiment

Figure 6:
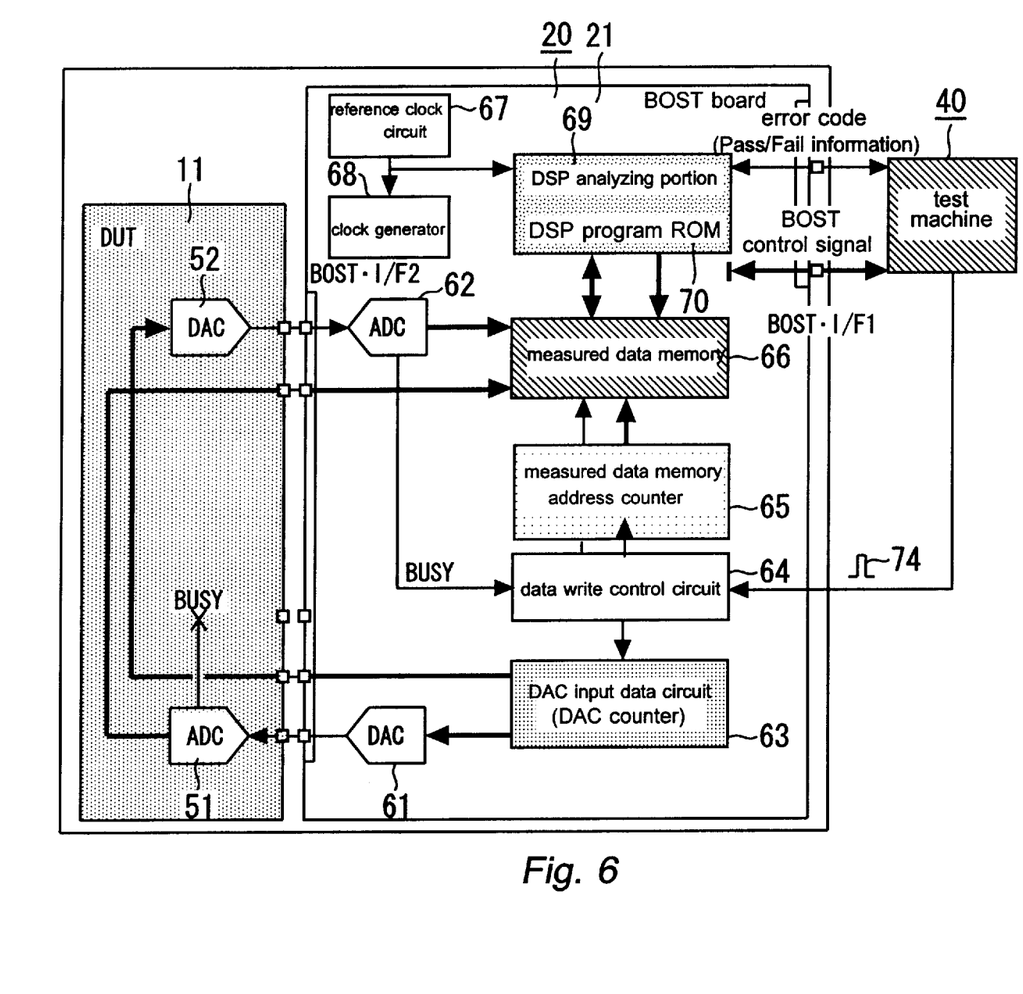
FIG. 6 is a block diagram showing the circuit configuration of Fifth Embodiment of a tester for semiconductor integrated circuits, and a testing method using the same according to the present invention.

FIG. 6 is a block diagram showing the circuit configuration of Fifth Embodiment of a tester for semiconductor integrated circuits, and a testing method using the same according to the present invention. In Fifth Embodiment, the A/D converter circuit 51 is of a type not generating BUSY signals. Therefore, trigger signals 74 are supplied from the tester 40 to advance the digital test data of the data circuit 63 in the digital unit, and to advance the address of the measured data memory 66. Since the A/D converter circuit 62 can be configured to generate BUSY signals, these BUSY signals can be used together with the trigger signals 74. Other configurations are the same as the configurations of FIG. 2.

Also in Fifth Embodiment, since the trigger signals 74 transmitted from the tester 40 to the BOST device 20 are digital signals, and no analog signal system, which is easily affected by noise, is added between the tester 40 and the BOST device 20, high-accuracy, high-speed test can be achieved as in First Embodiment.

According to the present invention, as described above, since the test assisting device disposed in the vicinity of the testing circuit board is provided with a data circuit, a testing D/A converter circuit, a testing A/D converter circuit, a measured data memory, and a DSP analyzing portion, and the test assisting device is made to conduct the test of the A/D converter circuit and the D/A converter circuit of a semiconductor integrated circuit to be tested, the test of a mixed signal type semiconductor integrated circuit comprising an A/D converter circuit and a D/A converter circuit can be conducted at high accuracy and high speed, and the cost reduction of the tester can be achieved.

Also in the tester of which the testing circuit board is provided with a socket to mount the molded IC, the test of the A/D converter circuit and the D/A converter circuit of the molded semiconductor integrated circuit is easily conducted, and if the testing circuit board provided with probes is used, the similar test can be easily conducted in the wafer state.

Also in the tester of which the test assisting device has a test assisting board comprising a data circuit, a testing D/A converter circuit, a testing A/D converter circuit, a measured data memory, and a DSP analyzing portion, the test assisting device can be concentrated on the test assisting board to simplify the device. In the tester of which the test assisting board is plugged in the socket of the testing circuit board, the assembly thereof can be simplified, and if the test assisting board is placed on the testing circuit board, the tester can be even simplified.

Also in the tester of which the test assisting device is directly mounted on the testing circuit board, the configuration of the tester can further be simplified.

Also in the tester that generates advance signals from the testing A/D converter circuit and the A/D converter circuit of the semiconductor integrated circuit to be tested, and that generates advance signals from the test machine, effective test can be conducted by advancing digital test signals, or the address of the measured data memory based on the advance signal.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-356724, filed on Nov. 22, 2000 including specification, claims, drawings and summary, on which the Convention priority of the present application is based, are incorporated herein by reference in its entirety.

What is claimed is:

1. A tester for semiconductor integrated circuits, comprising:

a testing circuit board configured to transmit signals to and receive signals from a semiconductor integrated circuit to be tested, said semiconductor integrated circuit comprising an A/D converter circuit to convert analog signals to digital signals and a D/A converter circuit to convert digital signals to analog signals;

a test assisting device disposed in the vicinity of and connected to the testing circuit board; and a test machine connected to said test assisting device, wherein said test assisting device comprises:
- a data circuit to generate digital test signals and to supply the digital test signals to the D/A converter circuit of said semiconductor integrated circuit to be tested;
- a testing D/A converter circuit to convert the digital test signals from the data circuit to analog test signals and to supply the analog test signals to the A/D converter circuit of said semiconductor integrated circuit to be tested;
- a testing A/D converter circuit to convert analog test outputs from the D/A converter circuit of said semiconductor integrated circuit to be tested to digital test outputs;
- a measured data memory to store the digital test outputs from the A/D converter circuit of said semiconductor integrated circuit to be tested and the digital test outputs of said testing A/D converter circuit; and
- an analyzer portion to analyze each of said digital test outputs stored in said measured data memory, and said tester for semiconductor integrated circuits is configured to supply, based on instructions from said test machine, said digital test signals and said analog test signals to said semiconductor integrated circuit to be tested, and to supply results of analysis of each digital test output stored in said measured data memory by said analyzer portion to said test machine.

2. The tester for semiconductor integrated circuits according to claim 1, wherein said semiconductor integrated circuit is constructed as a molded IC by enclosing a semiconductor integrated circuit chip with a molding resin, and leading a plurality of terminals from the molding resin, and said testing circuit board has a socket for mounting said molded IC.

3. The tester for semiconductor integrated circuits according to claim 1, wherein said semiconductor integrated circuit is included in a semiconductor wafer, and said testing circuit board is provided with a plurality of probes to contact said semiconductor integrated circuit.

4. The tester for semiconductor integrated circuits according to claim 1, wherein said test assisting device comprises a test assisting board that carries said testing D/A converter circuit, said testing A/D converter circuit, said measured data memory, and said analyzer portion.

5. The tester for semiconductor integrated circuits according to claim 4, wherein said test assisting board is constructed so as to be inserted in the socket on said testing circuit board.

6. The tester for semiconductor integrated circuits according to claim 4, wherein said test assisting board is mounted on said testing circuit board.

7. The tester for semiconductor integrated circuits according to claims 1, wherein said test assisting device is directly attached to said testing circuit board.

8. The tester for semiconductor integrated circuits according to claim 1, wherein said testing A/D converter circuit and the A/D converter circuit of said semiconductor integrated circuit to be tested output an advance signal each time a digital test output is outputted, whereby the digital test signal from said data circuit advances, and an address of the measured data memory is advanced.

9. The tester for semiconductor integrated circuits according to claim 1, wherein said test machine outputs an advance signal each time said A/D converter circuit of the semiconductor integrated circuit to be tested outputs a digital test output, and based on the advance signal, the digital test signal from said data circuit advances, and an address of the measured data memory is advanced.

10. A method for testing semiconductor integrated circuits comprising an A/D converter circuit for converting analog signals into digital signals, and a D/A converter circuit for converting digital signals into analog signals, said method using a test assisting device disposed in the vicinity of a testing circuit board configured to transmit signals to and receive signals from said semiconductor integrated circuit to be tested, said method comprising the steps of:
- generating digital test signals by a data circuit of the test assisting device to supply the digital test signals to the D/A converter circuit of said semiconductor integrated circuit to be tested;
- converting by a testing D/A converter circuit the digital test signals from said data circuit into analog test signals to supply the analog test signals to the A/D converter circuit of said semiconductor integrated circuit to be tested;
- converting by a testing A/D converter circuit analog test outputs of the D/A converter circuit of said semiconductor integrated circuit to be tested into digital test outputs;
- storing by a measured data memory the digital test outputs from the A/D converter circuit of said semiconductor integrated circuit to be tested and the digital test outputs of said testing A/D converter circuit; and
- analyzing by a analyzer portion each of said digital test outputs stored in said measured data memory,
- said digital test signals and said analog test signals being supplied to said semiconductor integrated circuit to be tested according to instructions from a test machine, and results of analysis of respective digital test outputs stored in said measured data memory by said analyzer portion being supplied to said test machine.

11. The method for testing semiconductor integrated circuits according to claim 10, wherein said semiconductor integrated circuits to be tested is a molded IC manufactured by enclosing a semiconductor integrated circuit chip with a molding resin and leading a plurality of terminals from the molding resin, and the test is conducted by mounting said molded IC to a socket of said testing circuit board.

12. The method for testing semiconductor integrated circuits according to claim 10, wherein said semiconductor integrated circuits to be tested is contained in a semiconductor wafer, and the test is conducted by bringing a plurality of probes provided on said testing circuit board into contact with said semiconductor integrated circuits to be tested.

13. The method for testing semiconductor integrated circuits according to claim 10, wherein said test assisting device comprises a test assisting board that carries said testing D/A converter circuit, said testing A/D converter circuit, said measured data memory, and said analyzer circuit, and the test is conducted by disposing said test assisting board in the vicinity of said testing circuit board.

14. The method for testing semiconductor integrated circuits according to claim 13, wherein the test is conducted by plugging said test assisting board in a socket on said testing circuit board.

15. The method for testing semiconductor integrated circuits according to claim 13, wherein the test is conducted by mounting said test assisting board on said testing circuit board.

16. The method for testing semiconductor integrated circuits according to claims 10, wherein the test is conducted by directly attaching said test assisting device to said testing circuit board.

17. The method for testing semiconductor integrated circuits according to claim 10, wherein the test is conducted in such a manner that an advance signal is output each time the digital test outputs are output by said testing A/D converter circuit and the A/D converter circuit of said semiconductor integrated circuit to be tested, and based on said advance signal, the digital test signal from said data circuit advances and the address of the measured data memory is advanced.

18. The method for testing semiconductor integrated circuits according to claim 10, wherein the test is conducted in such a manner that said test machine outputs an advance signal each time said A/D converter circuit of said semiconductor integrated circuit to be tested outputs a digital test output, and based on the advance signal, the digital test signal from said data circuit advances and the address of the measured data memory is advanced.

* * * * *